(12) United States Patent
Djordjevic et al.

(10) Patent No.: US 9,203,555 B2
(45) Date of Patent: Dec. 1, 2015

(54) OPTIMUM SIGNAL CONSTELLATION DESIGN AND MAPPING FOR FEW-MODE FIBER BASED LDPC-CODED CO-OFDM

(71) Applicant: NEC Laboratories America, Inc., Princeton, NJ (US)

(72) Inventors: Ivan B Djordjevic, Tuscon, AZ (US); Ting Wang, West Windsor, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 79 days.

(21) Appl. No.: 14/179,683

(22) Filed: Feb. 13, 2014

(65) Prior Publication Data
US 2015/0229437 A1 Aug. 13, 2015

(51) Int. Cl.
| | |
|---|---|
| *H03M 13/11* | (2006.01) |
| *H04L 1/00* | (2006.01) |
| *H04J 14/00* | (2006.01) |
| *H04L 27/26* | (2006.01) |
| *H04L 27/34* | (2006.01) |
| *H04L 27/36* | (2006.01) |

(52) U.S. Cl.
CPC ......... *H04L 1/0041* (2013.01); *H03M 13/1177* (2013.01); *H04J 14/002* (2013.01); *H04L 27/2626* (2013.01); *H04L 27/3405* (2013.01); *H04L 27/362* (2013.01)

(58) Field of Classification Search
CPC ..................................................... H03M 13/11
USPC ............................ 714/758, 784; 375/340, 346
See application file for complete search history.

(56) References Cited

U.S. PATENT DOCUMENTS

| | | | |
|---|---|---|---|
| 2004/0240590 A1* | 12/2004 | Cameron et al. | 375/340 |
| 2011/0096876 A1* | 4/2011 | Meyer | 375/346 |

OTHER PUBLICATIONS

McDonough, J., "Moving Standards to 100GbE and Beyond," IEEE Applications and Practice, Nov. 2007, pp. 6-9.
Liu, et al., "On The Optimum Signal Constellation Design for High-speed Optical Transport Networks," Optics Express, Aug. 2012, pp. 20396-20406, vol. 20, No. 18.
He, et al., "Comparison of Various Bandwidth-Efficient LDPC Coding Schemes for Tb/s Superchannel Long-haul Transmission," OFC/NFOEC Technical Digest, Mar. 2012, 3 pages.
Zou, et al., "LDPC-Coded Mode-Multiplexed CO-OFDM over 1000 km of Few-Mode Fiber," CLEO Technical Digest May 2012, 2 pages.
Djordjevic, et al., "Generalized OFDM (GOFDM) for Ultra-High-Speed Optical Transmission," Optical Express, Mar. 2011, pp. 6969-6979, vol. 19, No. 7.

* cited by examiner

*Primary Examiner* — Fritz Alphonse
(74) *Attorney, Agent, or Firm* — Joseph Kolodka

(57) ABSTRACT

A system/method for data transport, including encoding one or more streams of input data using one or more Low Density Parity Check (LDPC) encoders; employing one or more signal constellations obtained using an optimum signal constellation design (OSCD); determining an optimum mapping rule by comparing cost functions of each of a plurality of mapping rules; combining one or more LDPC-coded OSCD signal constellation data streams with coherent optical-orthogonal frequency division multiplexing (CO-OFDM) coded modulation to achieve channel capacity; and mode-multiplexing and transmitting one or more independent LDPC-coded optimum signal constellation design (OSCD) data streams over a transmission medium.

14 Claims, 6 Drawing Sheets

OPTIMUM SIGNAL CONSTELLATION DESIGN AND MAPPING FOR FEW-MODE FIBER BASED LDPC-CODED CO-OFDM

RELATED APPLICATION INFORMATION

This application claims priority to provisional application Ser. No. 61/760,371 filed on Feb. 14, 2013, incorporated herein by reference.

BACKGROUND

1. Technical Field

The present invention relates to coded modulation, and in particular, to systems and methods for data transport employing optimum signal constellation design (OSCD)-based low density parity check (LDPC)-coded coherent optical-orthogonal frequency division multiplexing (CO-OFDM).

2. Description of the Related Art

As the response to never ending demands for higher data rates and distance independent connectivity, 100 Gb/s Ethernet (GbE) standard has been already adopted, and higher speeds (e.g., 400 GbE, 1 TbE, etc.) have become the research focus of many researchers. IEEE recently ratified the 40/100 GbE standard IEEE 802.3ba. As the operating symbol rates increase, the deteriorating effects of fiber nonlinearities and polarization-mode dispersion (PMD) reach levels that inhibit reliable communication over the optical fiber network.

High speed (e.g., Terabit) optical Ethernet technologies may be affected by the limited bandwidth of information-infrastructure, high energy consumption, and heterogeneity of optical networking infrastructure, for example. As the operating symbol rates increase, the deteriorating effects of fiber nonlinearities and polarization-mode dispersion (PMD) reach levels that inhibit reliable communication over the optical fiber network. Furthermore, in the context of high-speed optical communication systems, not only the error correction performance but also the complexity of a coded modulation system plays a crucial role. To reach ultra high-speed (e.g., 1 Tb/s) serial date rates, extremely large signal constellation sizes are currently required for polarization-division multiplexed (PDM) single-carrier QAM systems, with commercially available symbol rates. However, as a signal constellation grows in size to increase its SE, so does the optical signal-to-noise ratio (OSNR) that is required to achieve a certain bit error ratio (BER) using conventional systems.

SUMMARY

A method for transmitting data, comprising encoding one or more streams of input data using one or more Low Density Parity Check (LDPC) encoders; employing one or more signal constellations obtained using an optimum signal constellation design (OSCD); determining an optimum mapping rule by comparing cost functions of each of a plurality of mapping rules; combining one or more LDPC-coded OSCD signal constellation data streams with coherent optical-orthogonal frequency division multiplexing (CO-OFDM) coded modulation to achieve channel capacity; and mode-multiplexing and transmitting one or more independent LDPC-coded optimum signal constellation design (OSCD) data streams over a transmission medium.

A system for transmitting data, comprising one or more Low Density Parity Check (LDPC) encoders configured to encode one or more streams of input data; a signal constellation generation module configured to generate one or more signal constellations using an optimum signal constellation design (OSCD); an optimum mapping rule determination module configured to determine an optimum mapping rule by comparing cost functions of each of a plurality of mapping rules; a combination module configured to combine LDPC-coded OSCD signal constellation data streams with coherent optical-orthogonal frequency division multiplexing (CO-OFDM) coded modulation to achieve channel capacity; and one or more mode-multiplexers and transmitters configured to mode-multiplex and transmit one or more independent LDPC-coded optimum signal constellation design (OSCD) data streams over a transmission medium.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

To solve problems associated with ultra-high speed (e.g., Terabit) optical Ethernet technologies (e.g., limited bandwidth of information infrastructure, high energy consumption, heterogeneity of optical networking infrastructure, etc.), low-density parity check (LDPC) optimum signal constellation design (OSCD)-based coherent optical-orthogonal frequency division multiplexing (CO-OFDM) coded modulation may be employed according to the present principles. In one embodiment, optimum signal constellation design (OSCD) combined with a corresponding optimized mapping rule, suitable for coherent optical (CO) OFDM transmission over an optical medium (e.g., few mode fiber (FMF)) may be employed according to the present principles, and enables ultra high speed transmission (e.g., beyond 1 Tb/s) over extremely long distances (e.g., over 1,000 km).

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1:
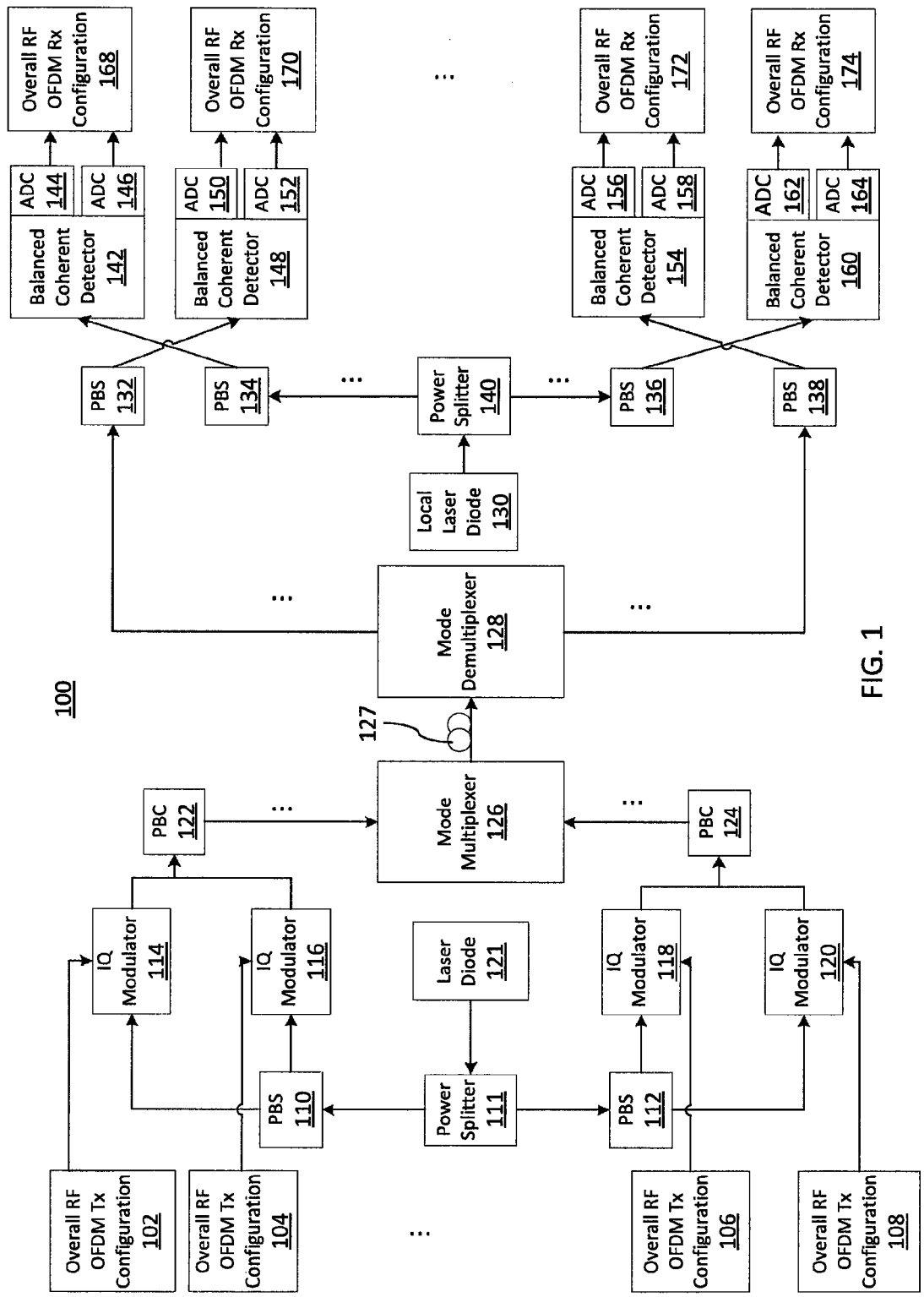
FIG. 1 shows a block/flow diagram illustrating an optical data transport system/method including low-density parity check (LDPC) optimum signal constellation design (OSCD)-based coherent optical-orthogonal frequency division multiplexing (CO-OFDM) according to the present principles.

Referring now in detail to the figures in which like numerals represent the same or similar elements and initially to FIG. 1, an optical data transport system/method including low-density parity check (LDPC) optimum signal constellation design (OSCD)-based coherent optical-orthogonal frequency division multiplexing (CO-OFDM) coded modulation 100 is illustratively depicted according to the present principles. In one embodiment, one or more radio frequency (RF) OFDM transmitters 102, 104, 106, 108 may send data to one or more in-phase/quadrature (I/Q) modulators 114, 116, 118, 120, which may then combine data streams using one or more polarization beam combiners (PBCs) 122, 124. A laser diode 121 may be employed, and a signal may pass through one or more power splitters 111 before passing through one or more PBSs 110, 112 and one or more I/Q modulators 116, 118 before passing through one or more PBCs.

In one embodiment, one or more independent LDPC-coded OSCD data streams may be mode-multiplexed using a mode multiplexer 126, and may be transmitted over a transmission medium 127 (e.g., few mode fiber (FMF), few core fiber (FCF), multi mode fiber (MMF), etc.). The data streams may be received and mode de-multiplexed in block 128, which may be followed by polarization beam splitting using one or more polarization beam splitters (PBSs) 132, 134, 136, 138, and may be followed by coherent detection by employing one or more balanced coherent detectors 142, 148, 154, 160. A local laser diode 130 may be employed as input to a power splitter 140, and the signal may be split using one or more PBSs 132, 134, 136, 138 before balanced coherent detection in blocks 142, 148, 154, 160. Signals may then be input into one or more analog to digital converters (ADCs) 144, 146, 150, 152, 156, 158, 162, 164, and the data may then be received by one or more RF OFDM receivers 168, 170, 172, 174.

In one embodiment, signal constellations may be generated using optimum signal constellation design (OSCD) in block 102. OSCD may be employed for ultra-high speed serial transmission (e.g., beyond 400 Gb/s) using a polarization division multiplexed (PDM) coded-modulation scheme based on signal constellations obtained by minimization of the mean-square error (MSE) of signal constellations representing the source for the optimum source distribution. In one embodiment, the optimum source distribution may be obtained by maximizing the channel capacity, based on the Arimoto-Blahut algorithm for a given finite-input finite-output channel. The Arimoto-Blahut algorithm may be employed to iterate probability mass functions to achieve convergence and optimum source distribution. Therefore, these signal constellations are optimum in the minimum MSE (MMSE) sense, and the method formulated in accordance with the present principles is thus named the MMSE-optimum signal constellation design (OSCD) method.

The OSCD-based constellations may be channel capacity achieving signal constellations, and may be combined with Low Density Parity Check (LDPC) codes of high girth (e.g., girth-8, girth-10, etc.). The constellations obtained by Cartesian products of existing 1-D and 2-D constellations can be used as well. Additionally, the constellations obtained by sphere-packing method can also be used in combination with a coded-modulation scheme in accordance with the present principles.

Figure 2:
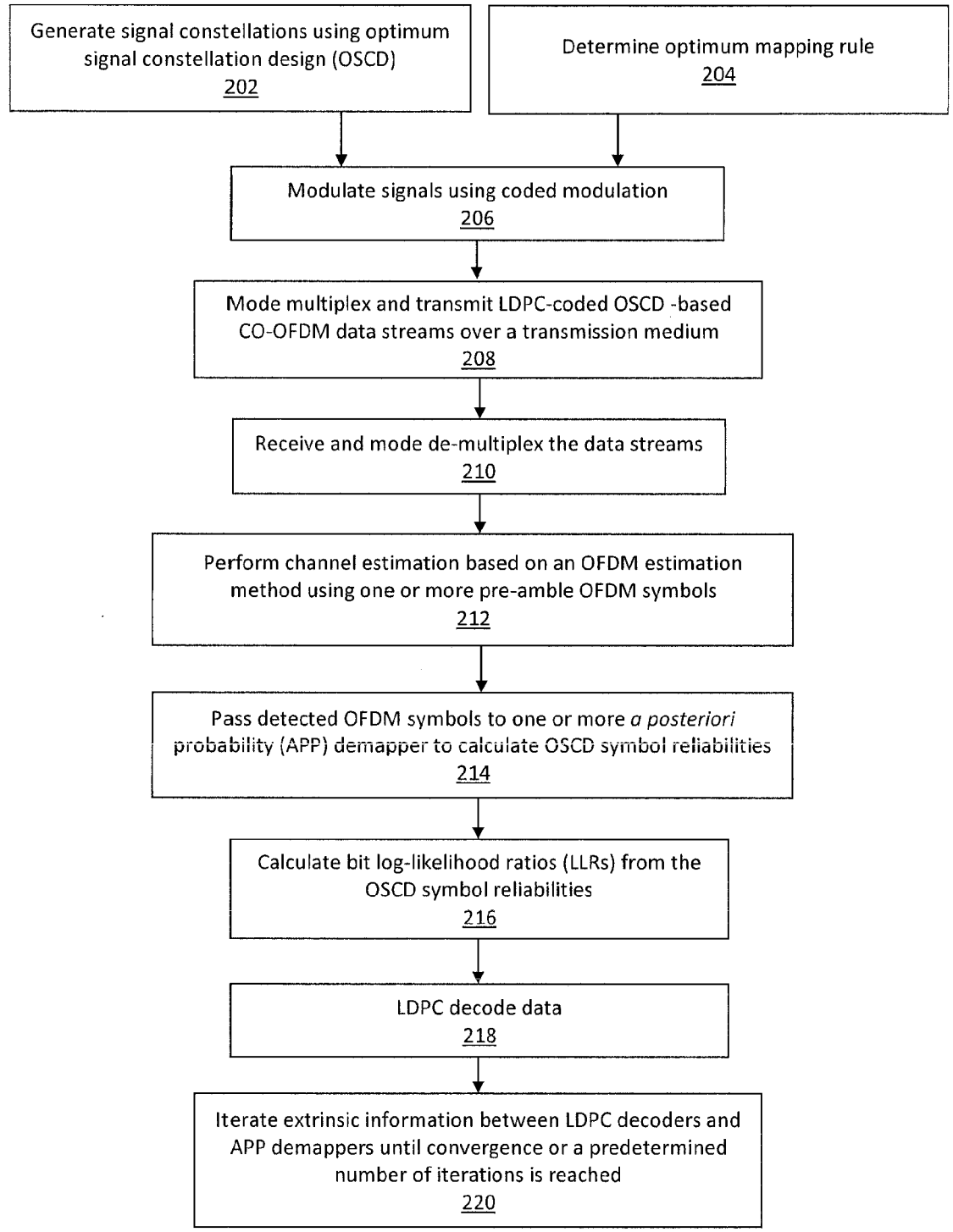
FIG. 2 shows a block/flow diagram illustrating a method for data transport including low-density parity check (LDPC) optimum signal constellation design (OSCD)-based coherent optical-orthogonal frequency division multiplexing (CO-OFDM) according to the present principles.

Referring now to FIG. 2, a block/flow diagram illustrating a method for data transport including low-density parity check (LDPC) optimum signal constellation design (OSCD)-based coherent optical-orthogonal frequency division multiplexing (CO-OFDM) is illustratively depicted according to the present principles. In one embodiment, signal constellations may be generated using optimum signal constellation design (OSCD) in block 202, and an optimum mapping rule may be determined in block 204. The signals may be modulated using coded modulation in block 206, and the LDPC coded OSCD-based coherent optical-orthogonal frequency division multiplexing (CO-OFDM) coded modulation streams may be transmitted over a transmission medium in block 208.

The data streams may be received and mode de-multiplexed in block 210, and channel estimation based on an OFDM estimation method using one or more pre-amble OFDM symbols may be performed in block 212. In one embodiment, a pilot-aided channel estimation technique may be performed by inserting several pilot subcarriers into each OFDM symbol with a specific period. Least-square (LS) method may be employed to estimate the pilot subcarrier coefficients in the first stage, and then a linear minimum mean-square error (LMMSE) estimator may be applied in a second stage using the following method:

$$\hat{H}_{p,LMMSE} = R_{H_p,H_p} \left( R_{H_p,H_p} + \frac{\beta}{SNR} I \right)^{-1} \hat{H}_{p,LS};$$

$p \in \{0, 1, \ldots, N_p - 1\}$, where $\hat{H}_{p,LS}$ is the least estimate of $H_p$. $SNR = E\{|X_p(k)|^2\}/\sigma_n^2$ and the average signal-to-noise ratio, $\beta = E\{|X_p(k)|^2\}E\{|1/X_p(k)|^2\}$ is a constant dependent on the signal constellation, and the covariance matrix is defined as $R_{H_p,H_p} = E\{H_p H_p^H\}$. This covariance matrix may be obtained by transmitting several OFDM symbols as pre-amble. The channel coefficients on data subcarriers may be linear interpolated from neighboring LMMSE pilot coefficients.

In one embodiment, optimized mapping rules may be employed in, for example, two-dimensional (2D) 8-ary OSCD and 2D 16-ary OSCD, and the cost function which may be used in determination of the optimum symbol mapping may be based on the error bound shown in detail below. For example, let $\{c_k = (c_k(1), \ldots, c_k(m))\}$ denote the coded and interleaved source sequences, and m denote the number of bits per symbol $c_k$. Each symbol $c_k$ may be mapped to an OSCD constellation point by $s_k = u(c_k)$, in which u is the mapping rule, and $s_k$ is the corresponding signal constellation point selected from the $2^m$-ary OSCD constellation. The cost function to determine the optimum mapping rule may be obtained using the following method:

$$f\left(\mu, X, \frac{E_s}{N_0}\right) = \frac{1}{m2^m} \sum_{i=1}^{m} \sum_{b=0}^{1} \sum_{s_k \in X_b^i} \sum_{\hat{s}_k \in X_{\bar{b}}^i} \exp\left(-\frac{E_s}{N_0} \|s_k - \hat{s}_k\|^2\right),$$

and the maximization of the cost function criterion may be employed to determine the optimum mapping rule.

In the equation for the cost function above, $X_b^i = \{s_k : s_k = u(c_k), c_k(i) = b, c_k \in \{0,1\}^m\}$ may denote the signal constellation subset whose bit labels are $b \in \{0,1\}$ at position $i \in \{1, \ldots, m\}$, $X_{\bar{b}}^i$ may denote the signal constellation subset whose bit labels are $\bar{b}$, $E_s/N_0$ is the symbol energy per power spectral density ratio, and $\|s_k - \hat{s}_k\|^2$ may denote Euclidean distance. Because the cost function is signal-to-noise ratio (SNR) dependent, SNR may be determined from target BER performance. To determine the optimized mapping rule, the cost function for each mapping rule may be calculated, and the mapping that maximizes the cost function may be determined. In one embodiment, OSCD-based constellations may be combined with LDPC codes of high girth, the optimized mapping rules may be used in combination with OSCD-based constellations, and the LDPC-coded OSCD method may be combined with CO-OFDM.

In one embodiment, detected OFDM symbols may be passed to an a posteriori probability (APP) demapper to calculate OSCD symbol reliabilities in block 214, and bit log-likelihood ratios (LLRs) may be calculated from the OSCD symbol reliabilities in block 216. The data may be LDPC decoded in block 218, and extrinsic information may be iterated between LDPC decoders and APP demappers until convergence or a predetermined number of iterations is reached in block 220.

Figure 3:
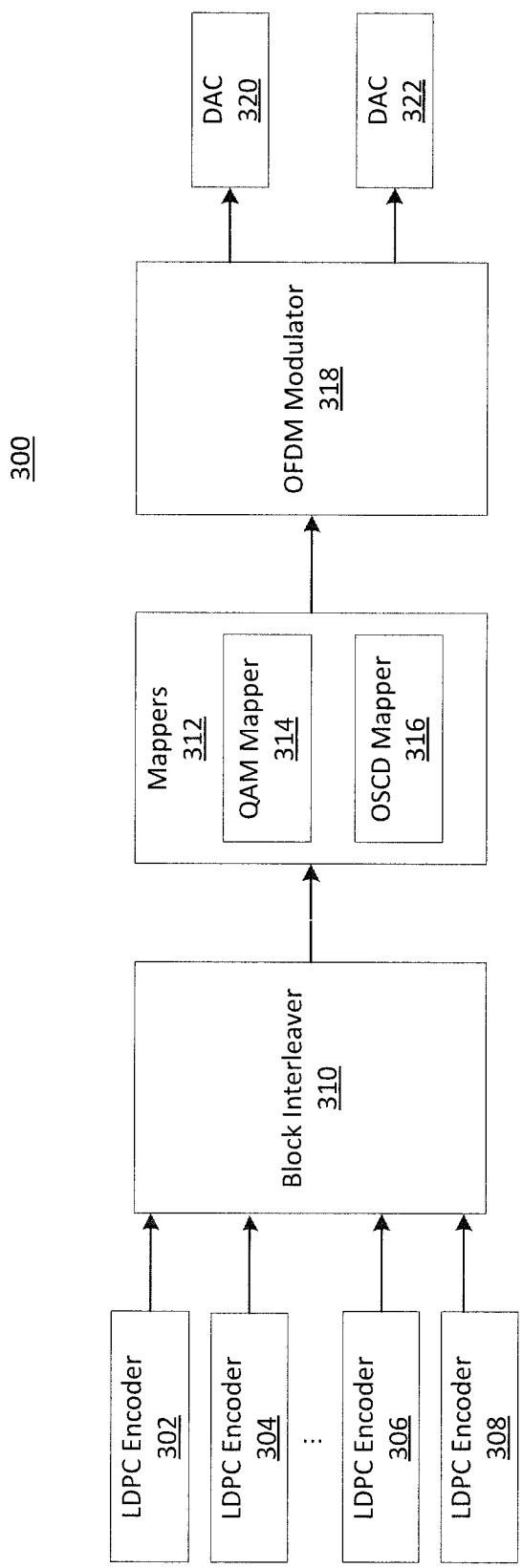
FIG. 3 shows a block/flow diagram illustrating a detailed representation of a radio frequency (RF) transmitter configuration according to the present principles.

Referring now to FIG. 3, a block/flow diagram showing a detailed representation of an RF OFDM transmitter 300 is illustratively depicted according to the present principles. In one embodiment, one or more binary LDPC encoders 302, 304, 306, 308 may be employed, and the encoded data may employed as input to a block interleaver 310, and may then pass through one or more mappers 312. The mappers may be any sorts of mappers including, for example, quadrature amplitude modulation (QAM) mappers 314 and OSCD mappers 316. The signal may be modulated using an OFDM modulator 318, and may then be used as input to one or more digital to analog converters (DACs) 320, 322. The binary LDPC encoders and block-interleaver may be substituted with a single nonbinary LDPC encoder.

Figure 4:
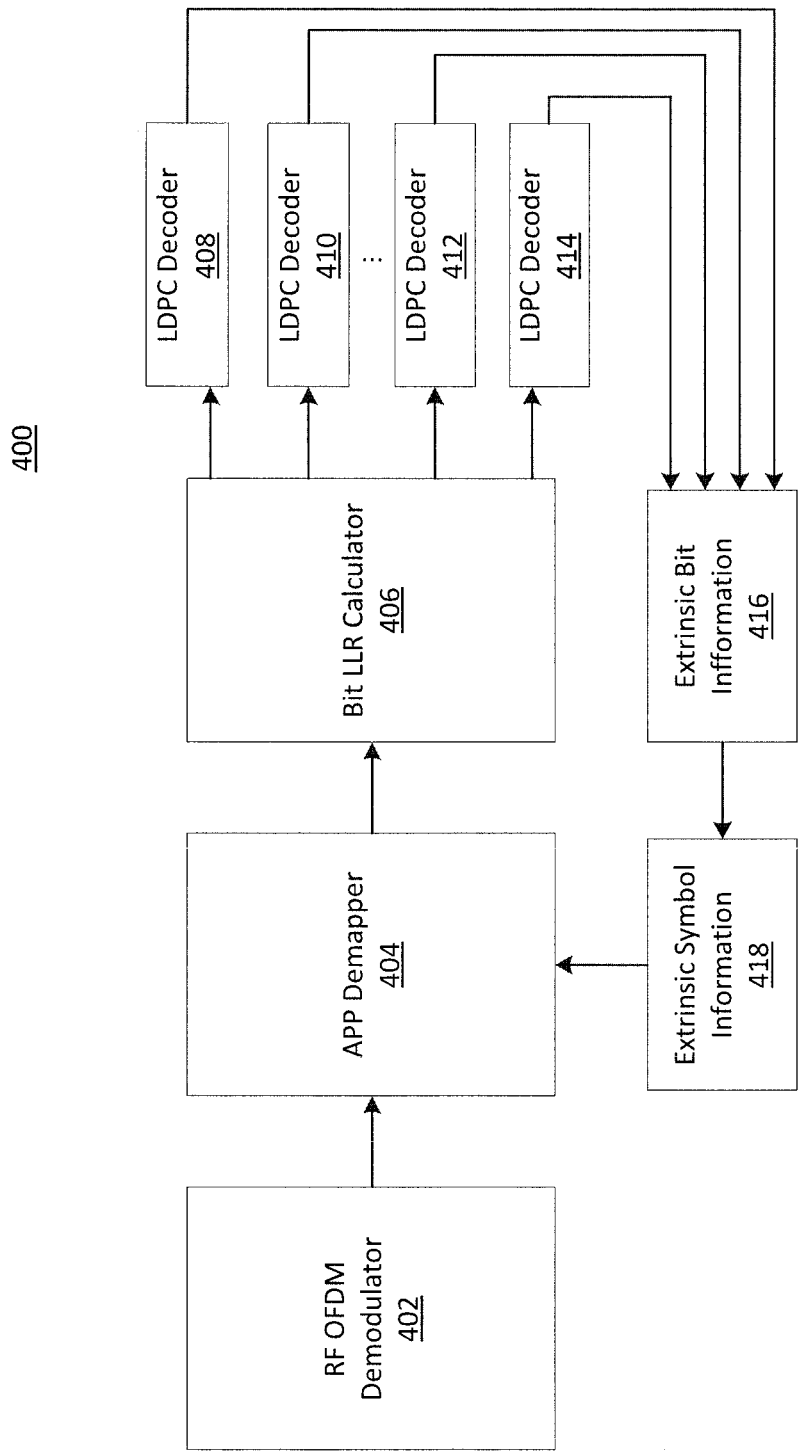
FIG. 4 shows a block/flow diagram illustrating a detailed representation of a receiver according to the present principles.

Referring now to FIG. 4, a block/flow diagram showing a detailed representation of a receiver 400 is illustratively depicted according to the present principles. In one embodiment, a signal may be received and demodulated using an OFDM RF demodulator 402, and may be employed as input to an APP demapper 404. Bit log-likelihood ratios (LLRs) may be calculated from the OSCD symbol reliabilities in block 406, and LDPC decoding may be performed by one or more LDPD decoders in blocks 408, 410, 412, 414. Extrinsic bit information 416, and extrinsic symbol information 418 may be iterated between LDPC decoders and APP demappers until either convergence or until a pre-determined number of iterations has been reached.

In one embodiment, channel estimation may be based on two-dimensional OFDM estimation method, which may a predetermined number of pre-amble OFDM symbols to estimate the channel and perform the compensation of mode-coupling and chromatic dispersion. The linear MMSE approach may be used to compensate for distortions introduced by channel, and the pre-amble OFDM symbols may also be used to estimate OSNR and channel correlation matrix. Several pilot symbols may be inserted inside the OFDM 2D packet to estimate for remaining optical channel impairments, and interpolation may be used to estimate optical channel coefficients for OFDM data subcarriers. After compensation of optical channel impairments, detected OSCD symbols may be passed to the APP demapper 404, which may be employed to calculate OSCD symbol reliabilities.

It is noted that while the above transmitter and receiver configurations are illustratively depicted, other sorts of transmitter and/or receiver configurations may also be employed according to the present principles.

Figure 5A:
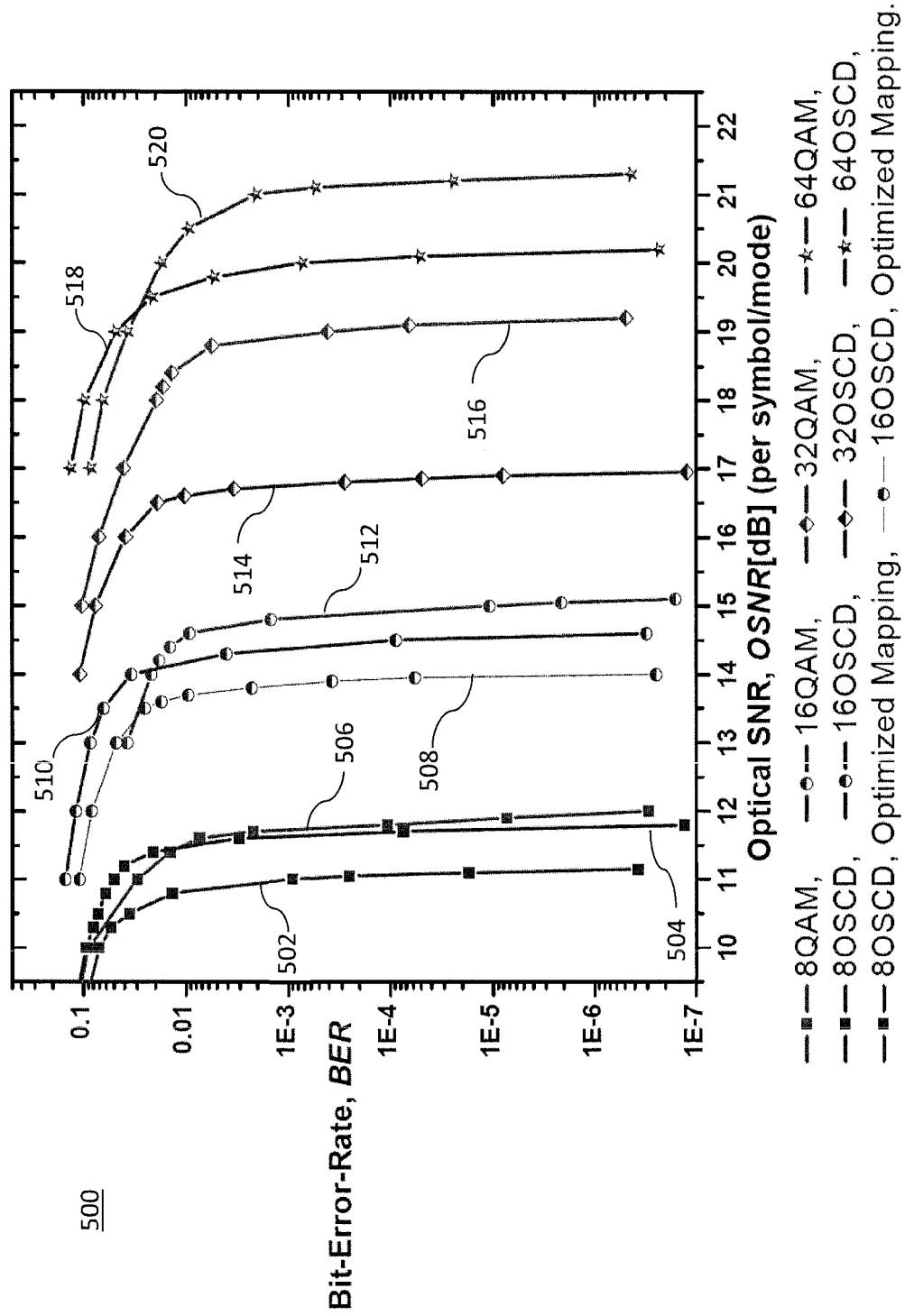
FIG. 5A shows plots of bit error rate (BER) versus optical signal-to-noise ratio (OSNR) for performance of low-density parity check (LDPC) optimum signal constellation design (OSCD)-based coherent optical-orthogonal frequency division multiplexing (CO-OFDM) coded modulation according to the present principles in a back-to-back configuration.
Figure 5B:
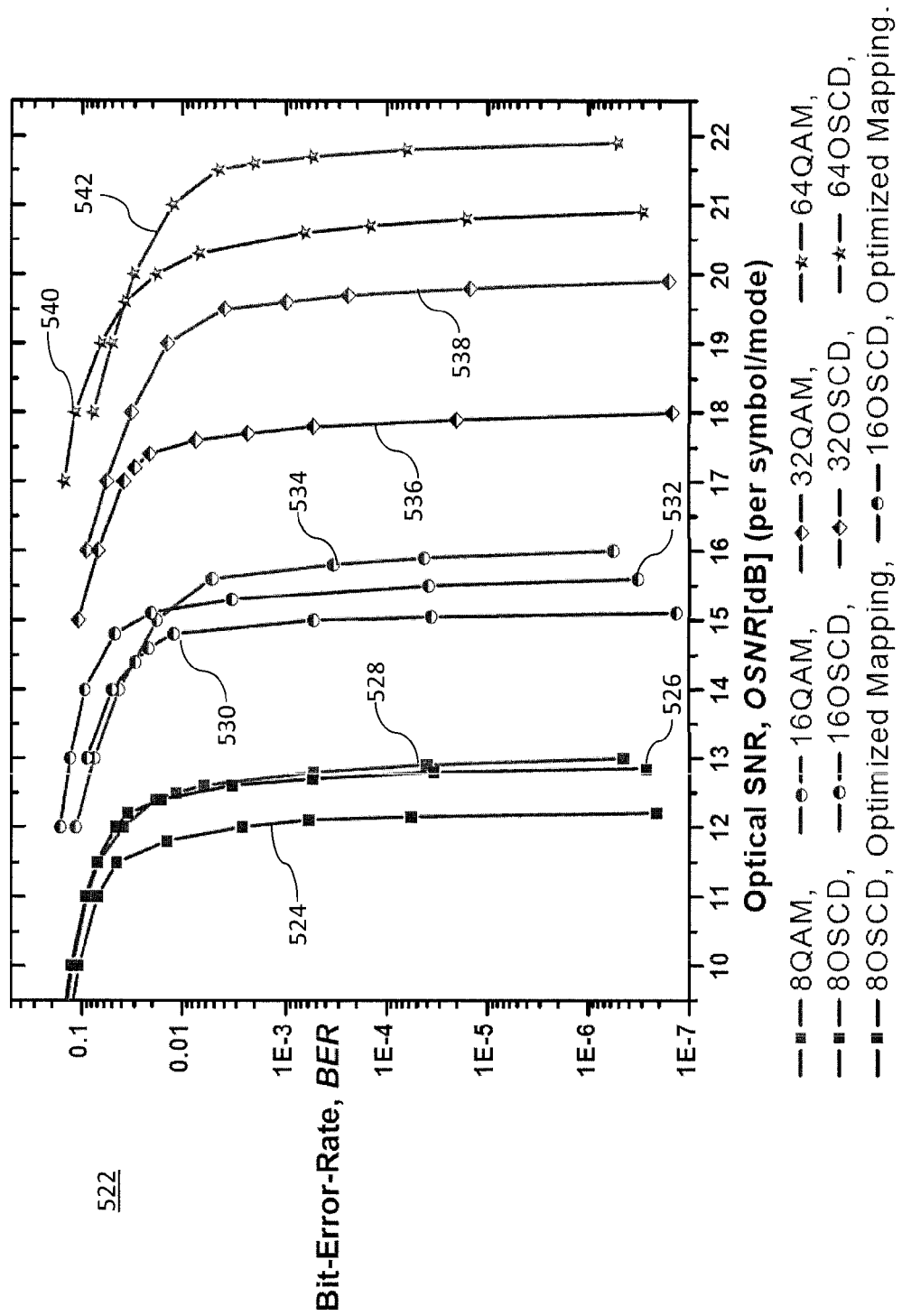
FIG. 5B shows plots of bit error rate (BER) versus optical signal-to-noise ratio (OSNR) for performance of low-density parity check (LDPC) optimum signal constellation design (OSCD)-based coherent optical-orthogonal frequency division multiplexing (CO-OFDM) coded modulation according to the present principles after very long distances (e.g., 1000 km of few mode fiber (FMF)).

Referring now to FIG. 5A and FIG. 5B, plots of bit error rate (BER) versus signal to noise ratio (SNR) for performance of low-density parity check (LDPC) optimum signal constellation design (OSCD)-based coherent optical-orthogonal frequency division multiplexing (CO-OFDM) coded modulation 500, 522 are illustratively depicted according to the present principles. In one embodiment, to illustrate the improvements that OSCD can bring together with optimized mapping rule for transmission over few-mode fiber in strong-coupling regime, the component LDPC code used in simulation is quasi-cyclic LDPC (16935,13550) code with code rate 0.8.

In one embodiment, 20 inner iterations and 5 outer iterations between a posteriori probability (APP) de-mapper LDPC decoders may be employed. The OFDM system parameters may be chosen as follows: the number of subcarriers may be set to 2048, and 64 of those are used as pilots. Cyclic extension may be set to 128 samples to accommodate for mode dispersion. LMMSE pilot estimator and linear interpolation may be jointly used for channel estimation and compensation, and the number of FMF modes may be set to four.

In simulations, four OFDM bands with 50 Giga symbols/s each (corresponding to 40 Giga symbols/s in effective information rate per band) have been used. Monte Carlo simulation results are summarized in FIG. 5A and FIG. 5B, in which the BER performance for both AWGN channel 500 and FMF of 1000 km in length 522 are shown. As shown in FIG. 5A, at a BER of $10^{-6}$, 8-ary OSCD 504 outperforms 8-QAM 506 by 0.2 dB with natural mapping and 0.85 dB with optimized mapping 502. The 16-ary OSCD 510 outperforms 16-QAM 512 by 0.5 dB with natural mapping and 1.1 dB with optimized mapping 508. Further, 32-ary OSCD 514 outperforms rectangular 32-QAM 516 by 2.25 dB. The 64-ary OSCD 518 outperforms 64-QAM 520 by 1.1 dB.

Referring now to FIG. 5B, in one embodiment, in which four independent data streams are mode-multiplexed and transmitted over 1000 km of FMF 522, the results indicate that 8-ary 524 and 16-ary OSCD 530 with optimized mapping will result in 0.85 dB and 0.9 dB OSNR gain as compared to 8-QAM 528 and 16-QAM 534, and 8-ary OSCD 526 and 16-ary OSCD 532 simulation results are also shown. In one embodiment, the 32-ary OSCD 536 and 64-ary OSCD 540 provide 1.9 dB and 1.0 dB improvement, respectively. Degradation in improvement compared to AWGN channel may be due to a limited number of training OFDM symbols having been used. Plots of 32-ary QAM 538, 64-ary QAM 542 are also depicted.

In one embodiment, as 16-ary OSCD 532 signal can achieve 320 Gb/s per single wavelength in two-mode fiber, with four OFDM bands, the present principles can be used to enable ultra high speed (e.g., 1 Tb/s) Ethernet over very long distances (e.g., 1000 km) of FMFs. Moreover, with 64-ary OSCD, four FMF modes, and four OFDM bands, the aggregate data rate of 3.84 Tb/s can be achieved. Therefore, by employing OSCD-based LDPC-coded CO-OFDM mode-multiplexing, ultra-high speed (e.g., multi-Tb/s) serial data transport may be enabled according to the present principles.

Having described preferred embodiments of an optical data transport system/method including low-density parity check (LDPC) optimum signal constellation design (OSCD)-based coherent optical-orthogonal frequency division multiplexing (CO-OFDM) coded modulation according to the present principles (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for transmitting data, comprising:
    encoding one or more streams of input data using one or more Low Density Parity Check (LDPC) encoders;
    employing one or more signal constellations obtained using an optimum signal constellation design (OSCD);
    determining an optimum mapping rule by maximizing and comparing one or more cost functions of each of a plurality of mapping rules to determine a mapping that maximizes a particular cost function of each of the plurality of mapping rules;
    combining one or more LDPC-coded OSCD signal constellation data streams with coherent optical-orthogonal frequency division multiplexing (CO-OFDM) coded modulation to achieve channel capacity; and
    mode-multiplexing and transmitting one or more independent LDPC-coded optimum signal constellation design (OSCD) data streams over a transmission medium.

2. The method as recited in claim 1, further comprising:
    receiving and mode-demultiplexing the one or more data streams;
    performing channel estimation based on two-dimensional (2D) orthogonal frequency division multiplexing (OFDM);
    calculating OSCD symbol reliabilities using one or more a posteriori probability (APP) demappers;
    LDPC decoding data using one or more LDPC decoders; and
    iterating extrinsic information between LDPC decoders and APP demappers until convergence or a predetermined number of iterations has been reached.

3. The method as recited in claim 1, wherein the OSCD-based constellations are combined with LDPC codes of high girth.

4. The method as recited in claim 1, wherein the transmission medium is one or more of single-mode fiber (SMF), few-mode fiber (FMF), few-core fiber (FCF), and few-mode-few-core fiber (FMFCF).

5. The method as recited in claim 2, wherein a pre-determined number of pre-amble OFDM symbols are employed during the channel estimation to estimate a channel, to perform compensation of mode-coupling and to perform chromatic dispersion.

6. The method as recited in claim 1, wherein the one or more signal constellations are generated using one of Cartesian products of existing 1-D and 2-D constellations or a sphere packing method.

7. The method as recited in claim 1, further comprising employing a linear minimum mean square error (MMSE) approach to compensate for distortions introduced in a channel.

8. A system for transmitting data, comprising:
    one or more Low Density Parity Check (LDPC) encoders configured to encode one or more streams of input data;
    a signal constellation generation module configured to generate one or more signal constellations using an optimum signal constellation design (OSCD);
    an optimum mapping rule determination module configured to determine an optimum mapping rule by maximizing and comparing one or more cost functions of each of a plurality of mapping rules to determine a mapping that maximizes a particular cost function of each of the plurality of mapping rules;
    a combination module configured to combine LDPC-coded OSCD signal constellation data streams with coherent optical-orthogonal frequency division multiplexing (CO-OFDM) coded modulation to achieve channel capacity; and
    one or more mode-multiplexers and transmitters configured to mode-multiplex and transmit one or more independent LDPC-coded optimum signal constellation design (OSCD) data streams over a transmission medium.

9. The system as recited in claim 8, further comprising:
    one or more receivers and mode-demultiplexers configured to receive and mode-demultiplex the one or more data streams;
    one or more channel estimation modules configured to perform channel estimation based on two-dimensional (2D) orthogonal frequency division multiplexing (OFDM);
    one or more a posteriori probability (APP) demappers configured to calculate OSCD symbol reliabilities;
    one or more LDPC decoders configured to decode LDPC coded data; and
    a feedback loop configured to iterate extrinsic information between LDPC decoders and APP demappers until convergence or a predetermined number of iterations has been reached.

10. The system as recited in claim 8, wherein the OSCD-based constellations are combined with LDPC codes of high girth.

11. The system as recited in claim 8, wherein the transmission medium is one or more of single-mode fiber (SMF), few-mode fiber (FMF), few-core fiber (FCF), and few-mode-few-core fiber (FMFCF).

12. The system as recited in claim 9, wherein a pre-determined number of pre-amble OFDM symbols are employed during the channel estimation to estimate a channel, to perform compensation of mode-coupling and to perform chromatic dispersion compensation.

13. The system as recited in claim 8, wherein the one or more signal constellations are generated using one of Cartesian products of existing 1-D and 2-D constellations or a sphere packing method.

14. The system as recited in claim 8, further comprising employing a linear minimum mean square error (MMSE) approach to compensate for distortions introduced in a channel.

* * * * *